United States Patent [19]

Leidich

[11] 4,295,101
[45] Oct. 13, 1981

[54] CLASS AB PUSH-PULL QUASI-LINEAR AMPLIFIERS

[75] Inventor: Arthur J. Leidich, Raritan Township, Hunterdon County, N.J.

[73] Assignee: RCA Corporation, New York, N.Y.

[21] Appl. No.: 102,131

[22] Filed: Dec. 10, 1979

[51] Int. Cl.³ .............................................. H03F 3/26
[52] U.S. Cl. ..................................... 330/262; 330/273
[58] Field of Search ............... 330/262, 271, 273, 270, 330/272, 274, 255

[56] References Cited

U.S. PATENT DOCUMENTS

| 2,896,029 | 7/1959 | Lin | 330/263 |
| 3,445,776 | 5/1969 | Leidich | 330/271 |
| 3,693,107 | 9/1972 | Long | 330/266 |
| 3,885,540 | 12/1974 | Leidich | 123/568 |
| 3,886,465 | 5/1975 | Mattfield | 330/267 |
| 3,886,466 | 5/1975 | Wheatley, Jr. | 330/272 |
| 3,887,880 | 6/1975 | Leidich | 330/270 |
| 4,004,091 | 1/1977 | Marley et al. | 178/70 |
| 4,078,207 | 3/1978 | Leidich | 330/273 |

FOREIGN PATENT DOCUMENTS 2,404,015  8/1975  Fed. Rep. of Germany ...... 330/255

Primary Examiner—James B. Mullins
Assistant Examiner—Gene Wan
Attorney, Agent, or Firm—Eugene M. Whitacre; Paul J. Rasmussen; Allen L. Limberg

[57] ABSTRACT

First and second direct-coupled cascade connections of like numbers of transistors of the same conductivity type are connected in push-pull. The output stages have common-emitter and common-collector-amplifier transistors, respectively, while earlier stages have common-collector and common-emitter-amplifier transistors, respectively, the common-emitter-amplifier transistor working into a constant current generator collector load.

13 Claims, 5 Drawing Figures

CLASS AB PUSH-PULL QUASI-LINEAR AMPLIFIERS

The present invention relates to types of quasi-linear amplifiers, each comprising a pair of component current amplifiers with matched current gains, with output circuits arranged in series to receive operating potential and in push-pull to deliver output signal, and with input circuits arranged to provide Class AB amplification of respective polarities of input signal swing for developing their respective contributions to that output signal.

In prior art amplifiers of this type, constructed using discrete electronic components, transistors of complementary conductivity types—e.g. NPN and PNP types—have been selected which have matching common-emitter forward current gains ($h_{fe}$'s) for use as the component amplifiers. Also known are so-called quasi-complementary configurations where the current gains of complementary-conductivity driver transistors with matching $h_{fe}$'s are augmented by cascade connections of them to output transistors of the same conductivity type as each other and with $h_{fe}$'s matching each other's. These amplifier designs are not well suited to applications where matching the $h_{fe}$'s of transistors of complementary conductivity types is infeasible—e.g. in integrated circuit quasi-linear amplifiers where matching of transistor current gains cannot be carried out practically by selection, but must instead be predicated upon the construction of the transistors by the same series of manufacturing process steps.

Integrated circuit designs of push-pull amplifiers have appeared in which a composite transistor of first conductivity type is operated in push-pull with a composite transistor of second conductivity type. This composite transistor of second conductivity type comprises a transistor of first conductivity type operated in concert with a current mirror amplifier connection of transistors of second conductivity type, the current mirror amplifier connection eliminating any dependency of the current gain of the composite transistor upon the current gains of its component transistors of second conductivity type. A problem with this approach to quasi-linear amplifier design is that it is difficult to match the bandwidths of the push-pull component amplifiers; dissimilar bandwidths give rise to phase distortion and make difficult phase compensation of overall linearizing feedback around the quasi-linear amplifier. In particular in conventional bipolar transistor integrated-circuit technology, the lateral structures used for realizing PNP transistors have restricted bandwidths, even in current mirror amplifier connection.

The component push-pull amplifiers of a quasi-linear amplifier embodying the present invention are each comprised of a plurality, N in number, of transistors of a first conductivity type in direct-coupled cascade connection. Push-pull operation is facilitated by operating one of the transistors in one of the direct-coupled cascade connections in common-collector configuration to supply base current to an ensuing transistor in that direct-coupled cascade connection, while the corresponding transistor in the other of the direct-coupled cascade connections is connected in common-emitter configuration to shunt a constant current generator supplying base current to an ensuing transistor in that direct-coupled cascade connection. This arrangement results in the output circuits of the final transistors in these direct-coupled cascade connections, which are serially connected to receive operating potential, exhibiting push-pull conduction in response to input signal being applied to the base electrodes of the first transistors in each direct-coupled cascade connection. The transistors in each of the direct-coupled cascade connections are biased to arrange for Class AB push-pull operation with equal idling currents in the output circuits of their respective final-amplifier-stage transistors.

Details of appropriate measures in this regard are furnished in the detailed description, following the general description of the drawing in which.

Figure 1:
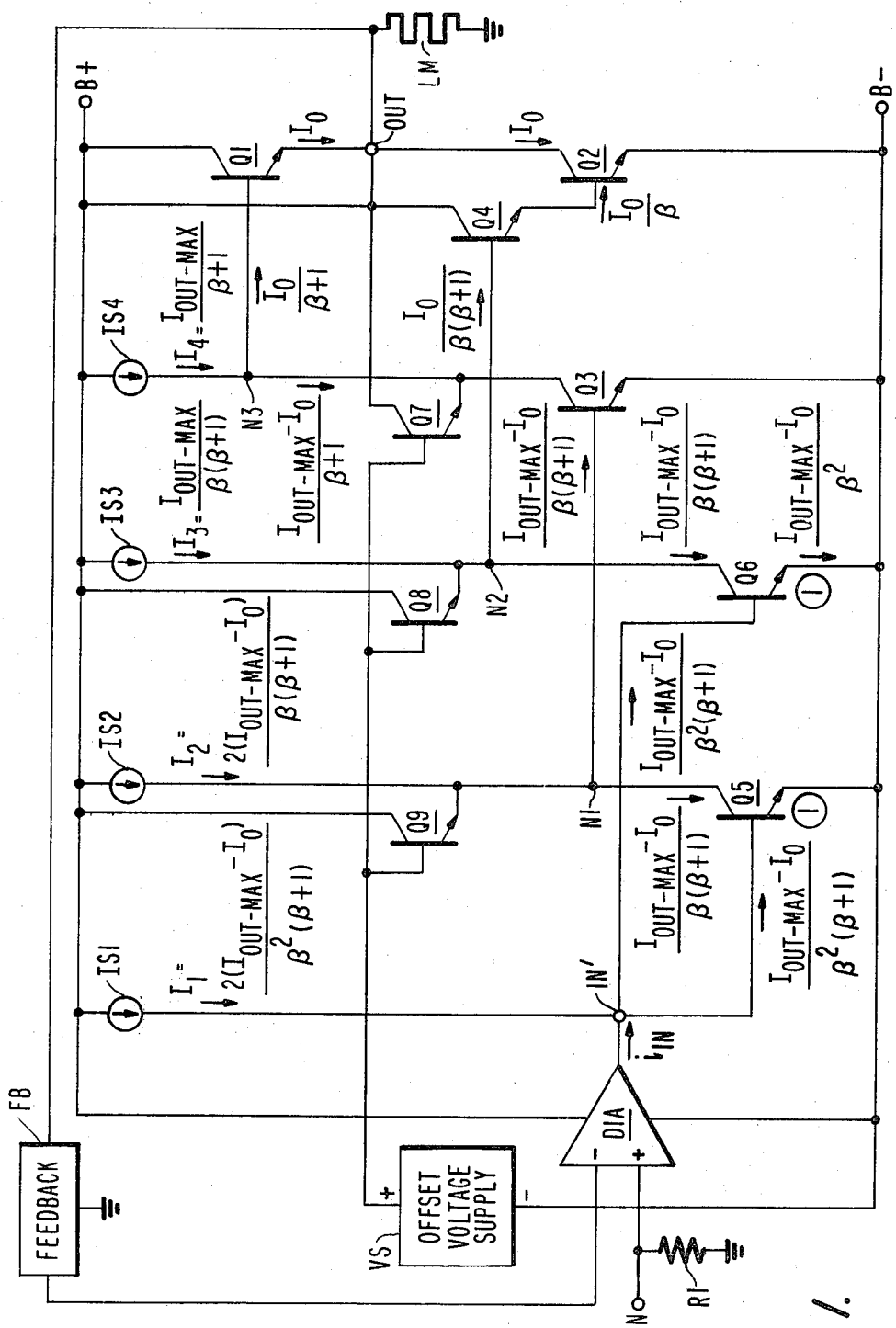
FIG. 1 is a schematic diagram of a quasi-linear amplifier embodying the present invention in a first of its more basic forms, with quiescent currents indicated thereon.
Figure 3:
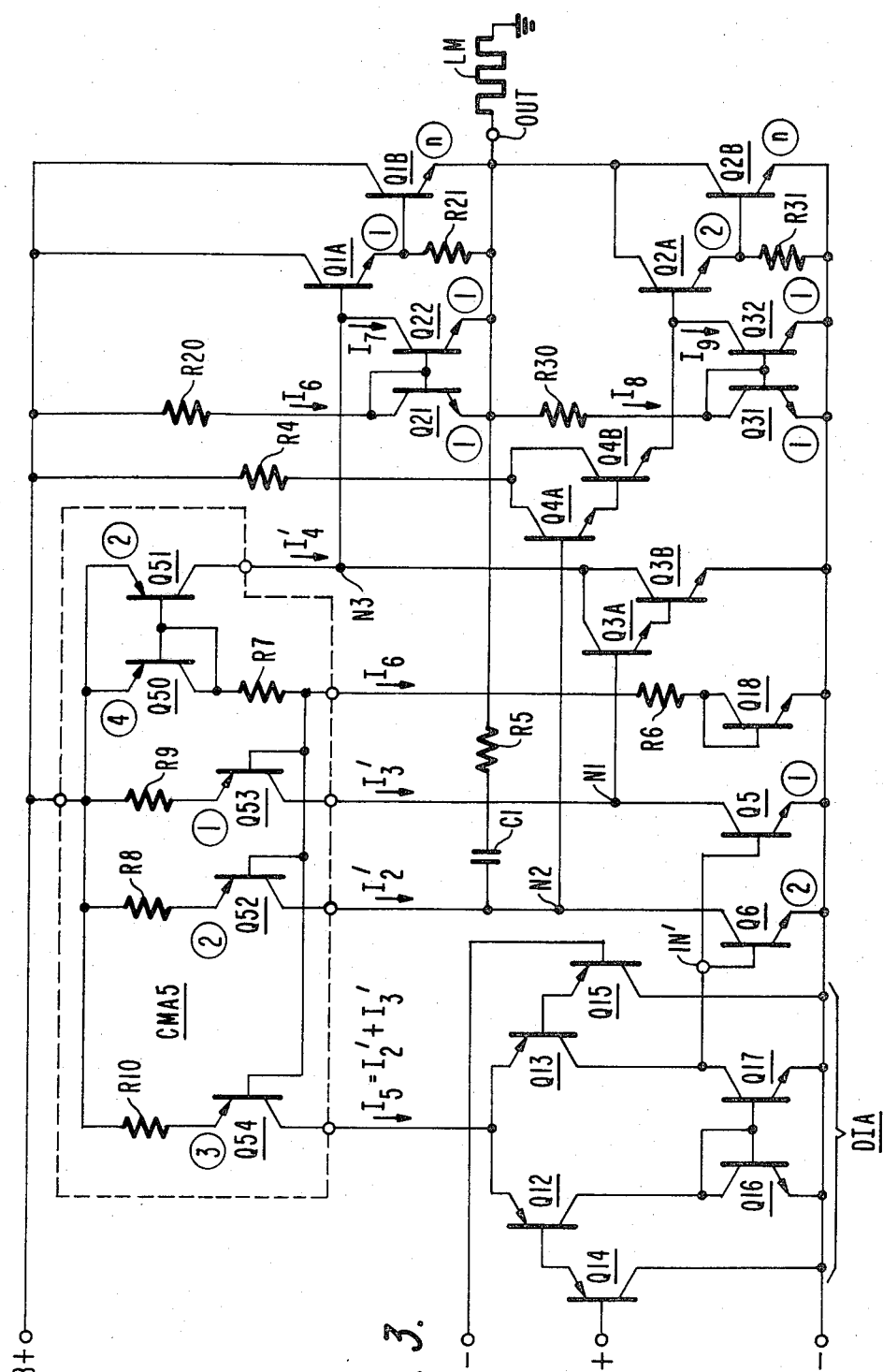
Figure 4:
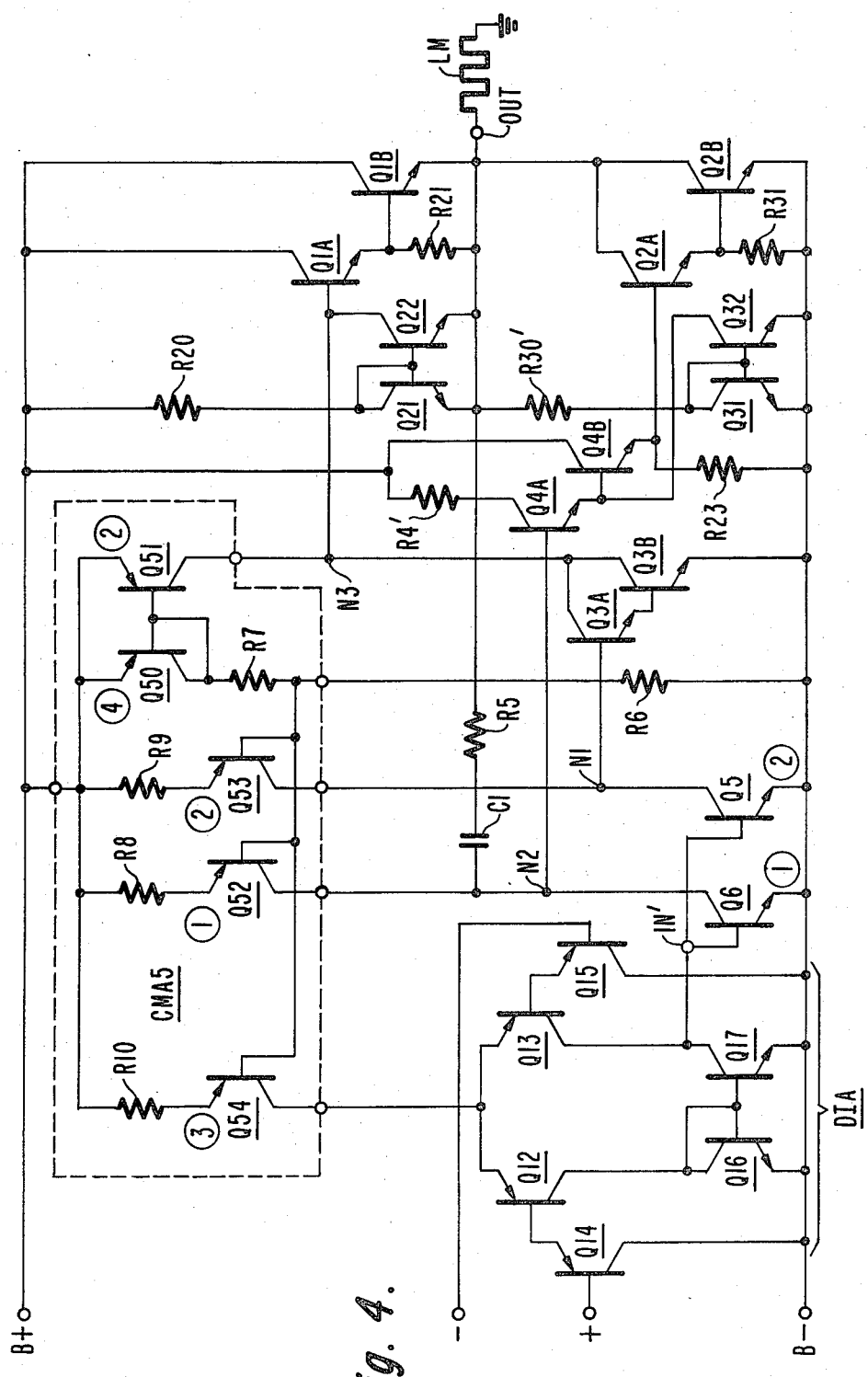
Figure 5:
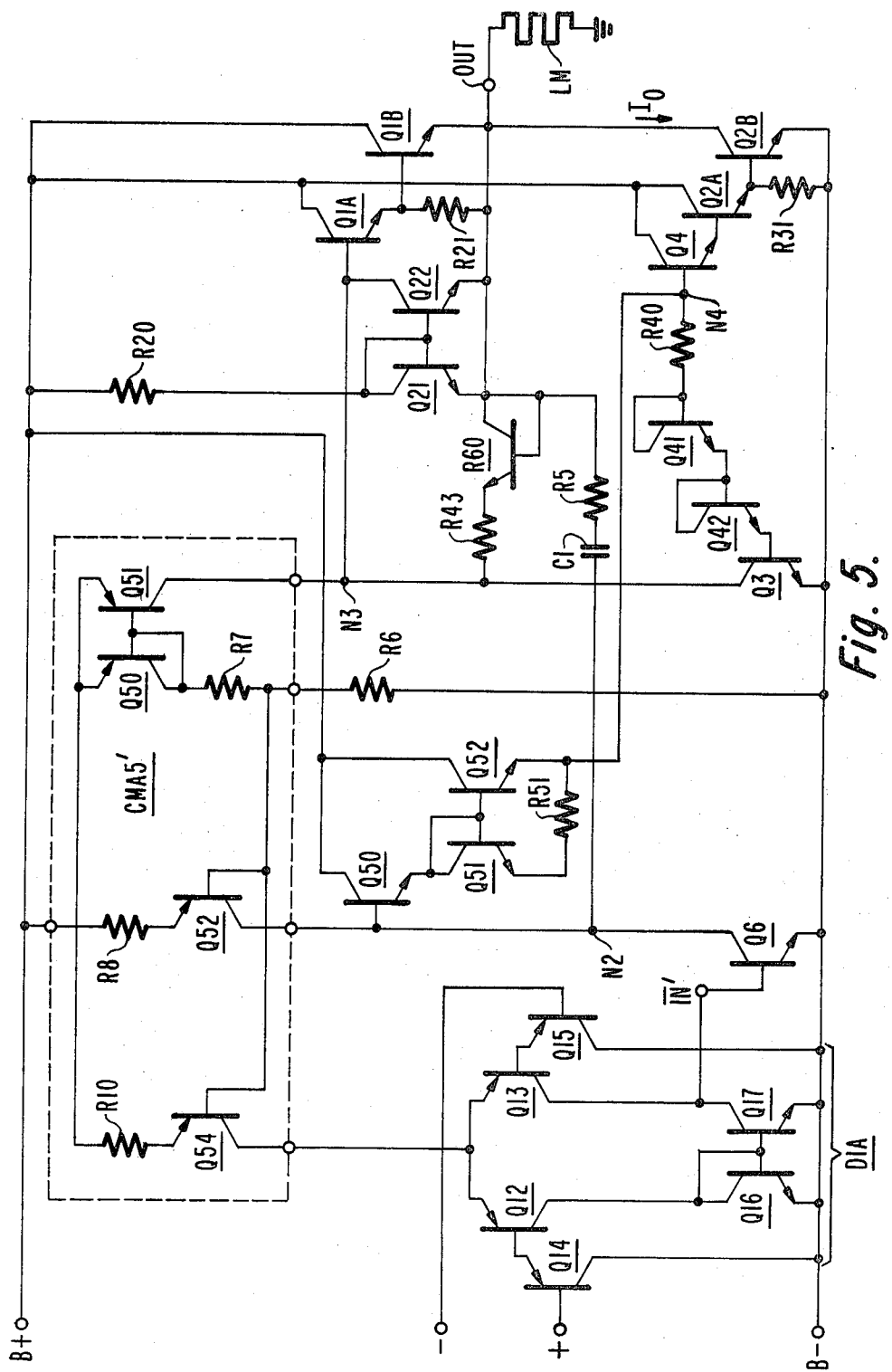

each of FIGS. 3 and 4 is a schematic diagram of a modified form of the FIG. 1 quasi-linear amplifier, embodying the present invention and incorporating load-line-limiting circuitry; and FIG. 5 is a schematic diagram of a quasi-linear amplifier embodying the present invention in a second of its more basic forms.

The FIG. 1 push-pull amplifier has an output signal terminal OUT, shown connected to supply output signal to resistive load means LM, to which terminal OUT emitter electrode of its first NPN output transistor Q1 and the collector electrode of its second NPN output transistor Q2 connect. The collector of Q1 connects to a bus receiving a relatively positive voltage B+, and the emitter of Q2 connects to a bus receiving a relatively negative voltage B−. The collector-emitter circuits of Q1 and Q2 are thus in series connection to receive operating potential equal to the difference between the B− and B+ voltages. Under quiescent conditions an idling current $I_0$ is to flow through the series connection of these collector-emitter circuits to minimize cross-over distortion during transitions of conduction from one of the output transistors Q1 and Q2 to the other, occurring responsive to excursions of input signal applied to terminal IN of the FIG. 1 push-pull amplifier.

Terminal IN is shown as being at the non-inverting input connection of a differential-input amplifier DIA, referred to ground in potential by means of resistor R1. DIA exhibits proportional response to the difference between input signal applied to its non-inverting input connection via terminal IN and feedback signal applied to its inverting input connection, delivering a current $i_{IN}$ from its output connection to terminal IN' at the input of the driver and power amplifier portions of the push-pull amplifier. The feedback signal applied to the inverting input of DIA is furnished by feedback network FB, responsive to voltage appearing at terminal OUT. The connections described in this paragraph are conventional features of integrated-circuit power amplifiers.

Q1 operates as a common-collector amplifier, being preceded in direct-coupled cascade connection by NPN transistor Q3 in common-emitter-amplifier connection. Q2 operates as a common-emitter amplifier, being preceded in direct-coupled cascade connection by NPN transistor Q4 in common-collector-amplifier connection. Terminal IN' connects to the interconnected base electrodes of NPN transistors Q5 and Q6. Q5 is connected as a common-emitter amplifier preceding in direct-coupled cascade connection the common-emitter-amplifier connection of Q3 and the common-collector-amplifier connection of Q1. Q6 is connected as a common-emitter amplifier preceding in direct-coupled cascade connection the common-collector-amplifier connection of Q4 and the common-emitter-amplifier connection of Q2. It is assumed in the following description that NPN transistors Q1, Q2, Q3, Q4, Q5 and Q6 are of sizes commensurate with the currents they are expected to conduct and are concurrently constructed by the same manufacturing process steps. Accordingly, their common-emitter forward current gains or $h_{fe}$'s can all be expected to be of substantially the same value, which will be denominated "$\beta$". Constant current generators IS1, IS2, IS3, and IS4 supply respective quiescent currents $I_1$, $I_2$, $I_3$, and $I_4$ to terminal IN', to node N1 at the interconnected collector of Q5 and base of Q3, to node N2 at the interconnected collector of Q6 and base of Q4, and to node N3 at the interconnected collector of Q3 and base of Q1, respectively, and do not affect signal current gain so long as the transistors they bias are conductive.

By properly choosing the relative magnitudes if $I_1$, $I_2$, $I_3$, and $I_4$, the FIG. 1 push-pull amplifier is (as will be explained in detail further on) biased for Class AB operation of Q1 and Q2, Q1 being conductive on positive excursions of $i_{IN}$ and Q2 being conductive on negative excursions of $i_{IN}$. The current gain for positive excursions of $i_{IN}$ is the $\beta$-valued current gain of common-emitter-amplifier transistor Q5, times the $\beta$-valued current gain of common-emitter-amplifier transistor Q3, times the $(\beta+1)$-valued current gain of common-collector-amplifier transistor Q1—i.e., the current gain of $\beta^2(\beta+1)$ exhibited by the direct-coupled cascade connection of the amplifier stages comprising Q5, Q3 and Q1. The current gain for negative excursions of $i_{IN}$ is the $\beta$-valued current gain of common-emitter-amplifier transistor Q6, times the $(\beta+1)$-valued current gain of common-collector-amplifier transistor Q4, times the $\beta$-valued current gain of common-emitter-amplifier transistor Q2—i.e., the current gain of $\beta^2(\beta+1)$ exhibited by the direct-coupled cascade connection of the amplifier stages comprising Q6, Q4, and Q2.

So, the possibility is established that the designer can attain, by the connections thus far described, the objective of equal current gains through the portions of the FIG. 1 push-pull amplifier that respectively handle responses to positive excursions of $i_{IN}$ and responses to negative excursions of $i_{IN}$. The remaining problem is the establishment of biasing for Q1 and Q2 as will condition them for operating Class AB.

Q4 and Q2 are connected for operating together as a current amplifier with current gain $\beta(\beta+1)$ so long as Q4 is supplied base current. For the condition where $i_{IN}$ has extreme negative excursions, the designer will desire to have Q1 non-conductive and to have Q1 demand at terminal OUT a collector current having the maximum level $I_{OUT-MAX}$ of the output current to be drawn through load means LM. The minimum value $I_{3-MIN}$ of $I_3$ which is required to supply a base current of $I_{OUT-MAX}/\beta(\beta+1)$ to the base of Q4 for supporting $I_{OUT-MAX}$ collector current demand from Q2 is $I_{OUT-MAX}/\beta(\beta+1)$, Q6 then having to be biased for non-conduction at this extreme negative excursion of $i_{IN}$. Now, under circumstances of quiescent operation, where collector current $I_0$ is to be demanded by Q2, to support this demand Q2 must be supplied base current $I_0/\beta$ from the emitter of Q4. To support the quiescent emitter current, $I_3$ must be supplied a quiescent base current of $I_0/\beta(\beta+1)$. To secure Class AB operation of Q4 and Q2, the remainder of $I_3$ must flow as quiescent collector current to Q6; for $I_3 = I_{OUT-MAX}/\beta(\beta+1)$ a quiescent collector current of $(I_{OUT-MAX}-I_0)/\beta(\beta+1)$ must be demanded by Q6, and quiescent base current of $(I_{OUT2-MAX}-I_0)/\beta^2(\beta+1)$ must be supplied Q6. This $(I_{OUT-MAX}-I_0)/\beta^2(\beta+1)$ quiescent base current is then, a first component of the current $I_1$ that constant current generator IS1 must supply to terminal IN'.

Negative excursions of $i_{IN}$ as apportioned to the base of Q6 will then cause decrease of the portion of $I_3$ that Q6 demands as collector current, thus permitting a complementary increase in the portion of $I_3$ that flows to the base of Q4, pulling Q4 and Q2 into proportionately increased conduction. Positive excursions of $i_{IN}$ as apportioned to the base of Q6 will, on the other hand, generate a collector current demand for Q6 that cannot be satisfied by the $I_3$ current supplied by constant current generator IS3. So, no portion of $I_3$ will be available as base drive current to Q4; Q4, and subsequently Q2, will be rendered non-conductive for lack of respective base drive currents. The complete diversion of base drive current $I_3$ from the base of Q4 on positive excursions of $i_{IN}$ sufficiently large to bring Q2 out of the cross-over region of shared conduction with Q1 is, then, the basic condition for biasing Q2 Class AB; and this condition is achieved by biasing the common-emitter-amplifier transistor Q3 to demand all of $I_3$ for these input signal conditions.

The biasing of Q1 for Class AB operation is carried out similarly, taking into account the fact that the current gain of common-collector-amplifier transistor Q1 is $(\beta+1)$, rather than the $\beta(\beta+1)$ current gain of the cascaded Q4 and Q2. Supposing the FIG. 1 amplifier to be designed for symmetrical driving of load means LM, for the condition where $i_{IN}$ has extreme positive excursions, the designer will desire to have Q2 non-conductive and to have Q1 supply to load means LM via terminal OUT an emitter current of the level $I_{OUT-MAX}$. The minimum value $I_{4-MIN}$ of $I_4$ which is required to supply a base current of $I_{OUT-MAX}/(\beta+1)$ to the base of Q1 to support such an output current level is $I_{OUT-MAX}/(\beta+1)$, Q3 then having to be biased for non-conduction at this extreme positive excursion of $i_{IN}$. Now, under circumstances of quiescent operation, where emitter current $I_0$ is to be supplied by Q1, Q1 must accordingly be supplied base current $I_0/\beta$ from constant current generator IS5. The remainder of $I_4$, $(I_{OUT-MAX}-I_0)/(\beta+1)$, assuming $I_4$ to be of minimum value $I_{4-MIN}$ must flow as quiescent collector current to Q3, in order to secure Class AB operation of Q1. In turn, quiescent base current of $(I_{OUT-MAX}-I_0)/\beta(\beta+1)$ must be supplied to Q3 to support a quiescent collector current demand of $(I_{OUT-MAX}-I_0)/(\beta+1)$.

Q3, like Q6, responds to positive excursions of signal current to its base electrode to generate a collector current that cannot be satisfied by the constant current generator connected to the same node as its collector. With Q3 these positive excursions will be of a $-\beta i_{IN}$ signal, however, and the constant current generator IS4 is connected to the same node N3 as the collector of Q3. Negative excursions of the $\beta i_{IN}$ signal current applied to its base will cause Q3 to decrease the portion of $I_4$ it demands as collector current, thus permitting a complementary increase in the portion of $I_4$ that flows to the base of Q1, pulling Q1 into proportionally increased conduction. To provide linear current amplification of the negative excursions of $\beta i_{IN}$ in Q3, there must be no substantial non-linearity of current amplification in the common-emitter-amplifier connection of Q5 for the positive excursions of $i_{IN}$ applied to its base. But, as importantly, there must be no substantial non-linearity of current amplification in the common-emitter-amplifier connection of Q5 for negative excursions of $i_{IN}$; otherwise the constancy of the apportionment of the current applied to terminal IN', as between base currents for Q5 and Q6, will be undesirably affected. Perforce Q5 must be operated Class A linear so long as Q6 is conductive, with a quiescent collector current of at least $(I_{OUT-MAX}-I_0)/\beta^2(\beta+1)$. This establishes the minimum value $I_2$-MIN for $I_2$ equal to 2 $(I_{OUT-MAX}-I_0)/\beta(\beta+1)$, the $I_2$ being supplied to N1 being equal to the quiescent base current of Q3 plus the quiescent collector current of Q5. Assuming $I_2 = I_{2-MIN} = 2(I_{OUT-MAX}-I_0)/\beta(\beta+1)$ and the quiescent collector current demand of Q5 being half that, the quiescent base current of Q5 should have a value $(I_{OUT-MAX}-I_0)/\beta^2(\beta+1)$.

Since their quiescent base current demands would then both be of an $(I_{OUT-MAX}-I_0)/\beta^2(\beta+1)$ value, constant current generator IS1 should supply an $I_1$ of $2(I_{OUT-MAX}-I_0)/\beta^2(\beta+1)$ for the particular design assumptions previously made. Making the emitter-base junction areas of Q5 and Q6 to be in 1:1 ratio as indicated by the encircled "ones" near their respective emitter electrodes, will cause Q5 and Q6 to divide $I_1$ equally between them, supposing Q5 and Q6 to have similar diffusion profiles.

The collector electrodes of Q3, Q6, and Q5 have the emitter electrodes of NPN transistors Q7, Q8, and Q9 respectively connected to them for preventing collector-bottoming, or saturation. The collectors of Q7, Q8, and Q9 connect to B+ supply voltage bus and their base electrodes are biased at about one volt's offset from B− supply voltage towards B+ supply voltage by an offset voltage supply VS. VS may, for example, be a one-and-one-have $V_{BE}$ supply of the sort described by A. L. R. Limberg in his U.S. Pat. No. 3,555,309, issued Jan. 12, 1971 and entitled "ELECTRICAL CIRCUITS". Preventing collector-bottoming, or saturation, of Q3, Q6 and Q5 maintains speed of response in the FIG. 1 push-pull amplifier after $i_{IN}$ over-swings. But, also, preventing collector-bottoming, or saturation, of Q5 and Q6 forestalls the attendant lowering of base input impedance due to $h_{fe}$ collapse that might otherwise adversely affect the equal division of input current between their base electrodes.

The design principles thus far discussed may be applied where $I_1$, $I_2$, $I_3$ and $I_4$ do not have their respective minimum values of $I_{1-MIN}$, $I_{2-MIN}$, $I_{3-MIN}$ and $I_{4-MIN}$. Departure from these minimum values may be desirable in order to loosen the tolerance upon $h_{fe}$ matching of Q1, Q2, Q3, Q4, Q5 and Q6, for example. Departure from those minimum values may be desirable when load-line-limiting circuitry is used to control the base drive currents to be made available to Q1 and Q2, as a further example. The ratio of the emitter-base junctions of Q5 and Q6 may then have to be adjusted to apportion $I_1$ and $i_{IN}$ correctly between the bases of Q5 and Q6. The collector of Q4 may connect to terminal OUT, rather than to B+ supply, without much effect on match of current gain in the two amplifier cascades forming the FIG. 1 push-pull amplifier; this will provide symmetrical voltage swing capabilities from ground towards B+ and B− operating voltages. In practice, the emitter of Q4 may be provided with some current sinking to speed turn-off of Q2 responsive to reductions in the emitter current of Q4, and $I_4$ may be augmented slightly to offset the effects of such current sinking.

Figure 2:
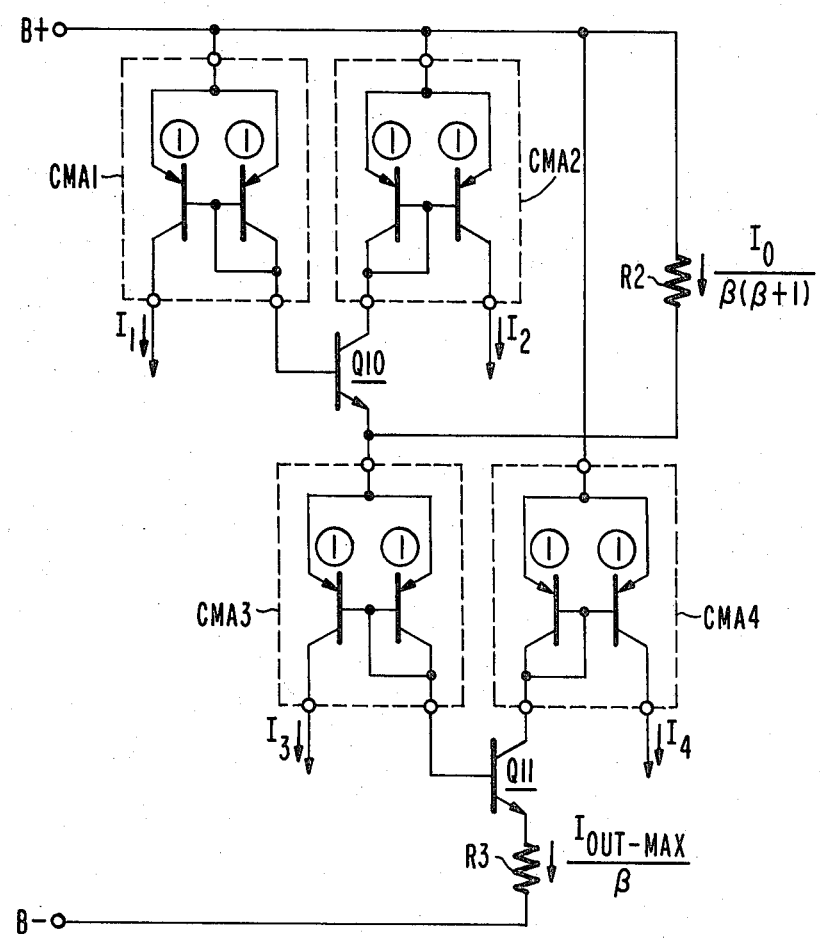
FIG. 2 is a schematic diagram of a current supply apparatus that can be used in connection with the FIG. 1 amplifier.

FIG. 2 shows representative current supply apparatus for use in the FIG. 1 push-pull amplifier. In this current supply apparatus current mirror amplifiers CMA1, CMA2, CMA3 and CMA4 supply $I_1$, $I_2$, $I_3$ and $I_4$ respectively from their output connections. The input connections of CMA1 and CMA2 are to the base and collector electrodes, respectively, of NPN transistor Q10 having an $h_{fe}$ of $\beta$; and the input connections of CMA3 and CMA4 are to the base and collector electrodes, respectively, of NPN transistor Q11 having an $h_{fe}$ of $\beta$. Each of the current mirror amplifiers CMA1, CMA2, CMA3 and CMA4 is presumed to have substantially minus unity times current gain as between its input and output connections, and to have substantially two times current gain as between its input and common connections. The common connections of CMA1, CMA2 and CMA4 are to the B+ supply voltage bus, and the common connection of CMA3 is to the emitter of Q10. The voltage at the emitter of Q10 is offset from B+ supply voltage by the input offset voltage of CMA1 and the emitter-to-base offset voltage of Q10—i.e., about 1.4 volts for the type of current mirror amplifiers shown. A resistor R2 connected between B+ supply voltage and the emitter of Q10 will in accordance with Ohm's Law have a current equal to this voltage, divided by the resistance $R_2$ of R2, which can be shown to be substantially $2/\beta(\beta+1)$ times as large as the $I_0$ that will flow in the FIG. 1 push-pull amplifier when supplier $I_1$, $I_2$, $I_3$ and $I_4$ supplied from the FIG. 3 apparatus. The voltage at the emitter of Q11 is further offset from B+ supply voltage than is the voltage at the emitter of Q10, by the input offset voltage of CMA3 and the emitter-to-base offset voltage Q11—i.e., about another 1.4 volts for the type of current mirror amplifiers shown. The voltage drop across resistor R3 connecting the emitter of Q11 to B− supply voltage is thus defined; and current through R3 will be equal to this voltage divided by the resistance $R_3$ of R3, which can be shown to be substantially equal to $I_{OUT-MAX}/\beta$ in the FIG. 1 push-pull amplier. $I_{OUT-MAX}/\beta$ is assumed to be substantially larger than $2I_0/\beta$, and $R_2$ and $R_3$ are chosen to set up the desired values of $I_{OUT-MAX}$ and $I_0$.

Proper operation of the FIG. 1 amplifier depends upon careful control of the relative magnitudes of quiescent currents $I_1$, $I_2$, $I_3$ and $I_4$; and this control relies heavily upon the matching of the $h_{fe}3$ s of transistors. This reliance is one which tends to reduce the yield of acceptable units in mass-manufactured integrated circuits. However, the reliance upon close matching of quiescent bias currents can be reduced in amplifiers of the same general type as the FIG. 1 push-pull amplifier, but in which load-line limiting circuitry is employed.

FIG. 3 shows a representative quasi-linear amplifier of the same general type as the FIG. 1 amplifier, but which includes load-line limiting circuitry. Q1 is replaced with the Darlington cascade connection of NPN transistors Q1A and Q1B; Q2, by the Darlington cascade connection of NPN transistors Q2A and Q2B; Q3 by the Darlington cascade connection of NPN transistors Q3A and Q3B; and Q4, by the Darlington cascade connection of NPN transistors Q4A and Q4B. Resistor R4 connecting the collectors of Q4A and Q4B to B+ supply voltage bus sets the maximum current flow through Q4A and Q4B during the collector-bottoming or saturation of Q4A, which current as amplified by the current gain of the Darlington cascade of Q2A, Q2B sets the maximum current that terminal OUT can sink on downward excursions of output signal. The maximum current that terminal OUT can source on upward excursions of output signal is determined by $I_4'$ as amplified by the current gain of the Darlington cascade of Q1A, Q1B. Capacitor C1 and resistor R5 are connected in series between terminal OUT and node N2 to provide the degenerative feedback at higher frequencies, desirable for stabilizing the amplifier against unwanted self-oscillatory tendencies. Collector clamping arrangements for preventing collector bottoming, or saturation, of Q5 and Q6 are unnecessary supposing the amplifier to operate Class A in those portions of the amplifier preceding the base-emitter junctions of Q1B and Q2B.

A four-output current mirror amplifier CMA5, with common connection to B+ supply voltage bus, supplies output currents $I_2'$, $I_3'$, $I_4'$, and $I_5$ in response to current $I_6$ flowing from its input connection to B− supply voltage bus via the series connection of resistor R6 and diode-connected transistor Q1B. CMA5 may be designed, for example, such that $I_2':I_3':I_4':I_5:I_6::1:2:2:3:4$. This would be done by scaling the collector current versus emitter-to-base voltage characteristics of PNP transistors Q52, Q53, Q51, Q54 and Q50, respectively, in 1:2:2:3:4 ratio and by scaling the conductances of resistors R8, R9, R10 and R7 in 1:2:3:4 ratio. Differential input amplifier D1A is shown as comprising: PNP transistors Q12 and Q13 in long-tailed-pair connection receiving $I_5$ as tail current at their interconnected emitter electrodes, PNP emitter-follower transistor Q14 coupling the non-inverting input terminal of DIA to the base of Q12, PNP emitter-follower transistor Q15 coupling the inverting input terminal of DIA to the base of Q13, and NPN transistors Q16 and Q17 in current mirror amplifier connection to convert the balanced signal variations in the collector currents of Q12 and Q13 to single-ended signal current variations for application to terminal IN'. Making $I_5$ substantially equal to the sum of $I_2'$ and $I_3'$ makes the sum of the quiescent base currents of Q16 and Q17 equal to the sum of the quiescent base currents of Q5 and Q6, neutralizing the effects of these base currents upon this balanced to single-ended signal conversion.

Load-line limiting of the drive current to the Darlington cascade connection of Q1A, Q1B is provided by resistor R20 and the current mirror amplifier (CMA) connection of NPN transistors Q21 and Q22. The voltage appearing between terminal OUT and B+ supply voltage bus, decremented by the emitter-to-base offset voltage of diode-connected Q21 is impressed across resistor R20 to determine (in accordance with Ohm's Law) the input current $I_6$ flowing to the CMA connection of Q21 and Q22, and consequently to determine the current $I_7$ demanded as collector current by Q22. Thus, the portion of the current $I_4'$ diverted to Q22 as collector current and away from Q1A as base drive current increases as the voltage between terminal OUT and B+ supply voltage bus increases. The resistance $R_{20}$ of R20 is chosen so that all of $I_4'$ is diverted to the collector of Q22 as increasing conduction of the Darlington cascade connection of Q2A and Q2B pulls terminal OUT closer to B− supply voltage than to B+ supply voltage by prescribed amount $\Delta V_{OUT}$. This assures that Q1A is biased out of conduction, so that Q1B is removed from conduction by action of its base pull-down resistor R21.

$I_4'$ is an output current of CMA5, the input current of which CMA depends upon the difference between B− and B+ supply voltages, as decremented by the emitter-to-base offset voltages of diode-connected NPN transistor Q18 and diode-connected PNP transistor Q50, divided by the combined resistances $R_6$ and $R_7$ of resistors R6 and R7. $I_4'$ is related to the input current of CMA5 by a constant factor determined by the relative conductances of PNP transistors Q50 and Q51 for their shared emitter-to-base voltage. $I_4'$ is, then, proportional to a voltage twice the quiescent voltage between terminal OUT and B+ supply voltage, assuming terminal OUT quiescent voltage to be substantially midway between B− and B+ supply voltages, making it easy by appropriately choosing the ratio of $R_{20}$ to $(R_6+R_7)$ to proportion $I_4'$ to be a fixed factor times as large as the quiescent value of $I_7$, which is proportional to the quiescent voltage between terminal OUT and B+ supply voltage.

The combined collector currents of Q3A and Q3B must have a quiescent value equal to $I_4'$ minus the quiescent value $I_{7(QV)}$ of $I_7$. So the conduction of Q5 under quiescent conditions must be set enough smaller than that of PNP transistor Q53 in CMA5, which supplies $I_3'$ from its collector, such that a quiescent base current is furnished to Q3A which is equal to $[I_4'-I_{7(QV)}]/(\beta^2+2\beta)$, assuming the common-emitter forward current gains of Q3A and Q3B each to have a value $\beta$. Now, if the collector current versus emitter-to-base voltage characteristics of Q5 and Q6 are related in the same proportion, m, as those of Q53 and Q52, the quiescent base current supplied to the base of Q4A will be m times $[I_4'-I_{7(QV)}]/(\beta^2+2\beta)$ owing to the imbalance in collector current conduction of Q52 and Q6. Here, where m=2, the base current supplied to Q4A has a quiescent value of $2[I_4'-I_{7(QV)}]/(\beta^2+2\beta)$ and the emitter current from Q4B has a quiescent value of $2[I_4'-I_{7(QV)}]$, assuming the common-emitter forward current gains of Q4A and of Q4B both to be of value $\beta$.

The choice of m to equal 2 is to facilitate most of the current flow through terminal OUT during cross-over in conduction from Q1B to Q2B and from Q2B to Q1B being delivered through the load-line limiting circuitry. Load-line limiting of the drive current to the Darlington cascade connection of Q2A, Q2B is accomplished using resistor R30 and the CMA connection of NPN transistors Q31 and Q32. The voltage appearing between B− supply voltage bus and terminal OUT, decremented by the emitter-to-base offset voltage of diode-connected Q31 is impressed across resistor R30 to determine the input current $I_8$ flowing to the CMA connection of Q31 and Q32, and consequently to determine the current $I_9$ demanded as collector current. The resistance $R_{30}$ of R30 is chosen so that under quiescent conditions $I_8$ equals $I_6+I_7$, so Q1B and Q2B need not conduct substantially at cross-over. Then, supposing the CMA connection of Q31 and Q32 to have the same current gain as the CMA connection of Q21 and Q22, quiescent $I_9$ demand will be twice the quiescent $I_7$ demand. This value of $R_{30}$ causes all of the emitter current of Q4B to be diverted to the collector of Q32 as increasing conduction of the Darlington cascade connection of Q1A and Q1B pulls terminal OUT closer to B+ supply voltage than to B− supply voltage by prescribed amount $\Delta V_{OUT}$. This assures that Q2A is biased out of conduction, so that Q2B is removed from conduction by action of its pull-down resistor 31. Choosing the quiescent value of $I_7$ to be half $I_4'$ secures quite symmetrical current amplification if one chooses pull-down resistor R31 to have a resistance R31 one-half the resistance of $R_{21}$ of pull-down resistor R21.

Assuming the non-inverting input signal terminal (+) at the base of Q14 to be biased midway between the B− and B+ voltages in operation, and assuming direct coupled overall voltage feedback without voltage translation, from terminal OUT to the inverting input signal terminal (−) at the base of Q15, the error current supplied to terminal IN' will adjust conduction of Q5 and Q6 to set up the design values of the relatively very small Q3A and Q4A base currents, unbalance between the two halves of the amplifier being adjusted against by action of the load limiting circuitry. $R_{21}$ and $R_{22}$ can be chosen of sufficiently low value that Q1B and Q2B are non-conductive in the cross-over region with Q1A and Q2A handling current variations on a substantially Class A basis in this region; this arrangement will then exercise primary control of Class AB operation of Q1B and Q2B. The increased leeway in adjusting the biasing of terminal IN' with direct-coupled overall feedback to balance conduction in the push-pull amplifier halves that is afforded by the use of load-line-limiting circuitry, together with the reduction overall feedback affords in distortion arising from somewhat unequal current gains in the amplifier portions operated in push-pull with each other, permits considerable variation in the design of this type of amplifier.

FIG. 4, for example, shows a push-pull amplifier similar to that of FIG. 3, but with the load-line-limiting circuitry for controlling conduction of Q2B moved forward in the amplifier to control the base of Q4B. R4', in the collector circuit of Q4A alone, replaces R4 in determining the maximum drive current to be supplied the base of Q2A.

A phenomenon that is noted when one constructs in monolithic integrated circuit form a push-pull amplifier according to the present invention, which has theoretically equal current gains in the two amplifier chains the output circuits of which connect in push-pull, is that there is a tendency for the common-emitter amplifier portion of the amplifier to exhibit less current gain than it should. This undesirable phenomenon comes about because the i-c metalization connecting the emitter of that transistor to supply introduces emitter degeneration resistance, which reduces the gain in that transistor appreciably unless thick, wide metalization is used. A more feasible solution is to permit the phenomenon to occur, but to compensate for its occurrence by providing for greater base drive to the common-emitter-amplifier output transistor than to the common-collector amplifier one.

This is provided for in the FIG. 4 amplifier by scaling the areas of the base-emitter junctions of Q6 and Q5 in 1:2 ratio, so two-thirds of the input signal current supplied terminal IN' by differential-input amplifier DIA flows to Q6, and only one-third of the input signal current flows to Q5. To accommodate the resulting quiescent collector current needs of Q5 and Q6, the resistances of R8 and R9 and the collector current versus applied emitter-to-base voltage characteristics of Q52 and Q53 are reapportioned so that the collector current of Q53 is twice that of Q52.

Insofar as the details of the rest of the quiescent biasing are concerned, a primary consideration is to bias Q1B and Q2B just out of conduction for 125° C. operation, which condition is associated with their quiescent emitter-to-base voltages $V_{BE\text{-}Q1B}$ and $V_{BE\text{-}Q2B}$ having a value of about 0.4 V. at that temperature. The resistances of R21 and R22 are chosen to provide adequate pull-down to assure desired upper frequency of response, 200 ohms in this design example, and this defines according to Ohm's Law the quiescent emitter currents (2 mA) that must flow from Q1A and Q2B. The $h_{fe}$'s of Q1A and Q2A range from 100 to 120, so their quiescent base currents are no more than about 20 μA, which will be negligible compared to the quiescent collector-to-emitter current levels to be established for Q3B and Q4A. The emitter-to-base voltage $V_{BEQ4A}$ of Q4A for a 2 mA emitter current is about 0.5 V. at 125° C. This makes the quiescent base voltage of Q2A about 0.9 V. more positive that B− supply voltage. The resistance of resistor R23 connected between B− supply voltage bus and the emitter of Q4B is chosen to be 900 ohms, such that the current flow therethrough has a value of 1 mA response to 0.9 V. drop thereacross, in accordance with Ohm's Law.

The resistances of R6 and R7 are made 6800 and 620 ohms, respectively, to set up a 4 mA, current therethrough responsive to a 30 V. difference between B− and B+ voltages, the 30 V. difference being decremented by the $V_{BE}$ drop of Q50 to set the voltage drop across the series connection of R6 and R7. The ½ current gain associated with the current mirror amplifier action of Q50 and Q51 sets up a collector current of 2 mA from Q51, which is the maximum drive current available to the Darlington-like connection of Q1A and Q1B. The resistance of R4' is chosen to be 6200 ohms to limit the maximum drive current available to common-collector-amplifier transistor Q21 and thence to the Darlington-like connection of Q22, Q23. The resistance of R4' has to be chosen empirically owing to the degeneration of Q2B by its emitter metalization, alluded to above.

In the cross-over region, amplification is carried forward by Class A operation of Q2A as common-emitter amplifier working into a collector load determined by the load-line limiting circuitry. The resistance of R20 is chosen to be 5000 ohms. So, about 3 mA. of quiescent current flows through it and diode-connected transistor Q21, causing Q22 to demand the total collector current of Q51 and resulting in the combined quiescent emitter currents of Q21 and Q22 having a value of 5 mA. R30' is chosen to be 3900 ohms, so about 4 mA. of current flows through it and diode-connected transistor Q31. This leaves about 1 mA. of the combined emitter currents of Q21 and Q22 to flow as quiescent collector current in Q2A. Q32 demands a quiescent collector current of 4 mA. responsive to the 4 mA. current flow through diode-connected transistor Q31.

R8, R9 and R10 are chosen to have resistances of 2480, 1240, and 827 ohms, respectively, to place the collector currents of Q52, Q53 and Q54 in 1:2:3 ratio at levels sufficiently high that the base currents of Q3A and Q4A are negligible compared to the collector currents of Q53 and Q52, respectively. Resistor R5 has a resistance of 390 ohms, and capacitor C1 has a capacitance of 2000 pF.

The FIG. 5 amplifier uses a common-emitter amplifier connection of Q6, but does not parallel it with the common-emitter amplifier connection of Q5. Current mirror amplifier CMA5' differs from CMA5 in dispensing with Q53 and R9, used in the FIGS. 3 and 4 amplifiers to supply collector bias current to Q5. Resistors R6, R7, R8 and R10 have resistive values of 6500, 620, 2480 and 2480 ohms, respectively; and the emitter-base junction areas of Q50, Q51, Q52 and Q53 are in 4:5:1:1 ratio, resulting in Q51, Q52 and Q54 supplying quiescent currents of 5 mA, 1 mA and 1 mA, respectively, when the difference in B− and B+ supply voltages is 30 V. A single common-emitter amplifier transistor Q3 is used to divert current from node N3 in place of Darlington connected Q3A and Q3B. The base of Q2A is driven from node N4 by the emitter-follower action of a single transistor Q4; and the base of common-emitter amplifier transistor Q3 also is driven from node N4 via the series connection of resistor R40 and forward-poled diode-connected transistors Q41 and Q42. Load-line limiting circuitry for limiting base drive to Q2A is dispensed with, since a sneak path for undesired regeneration would otherwise obtain, undesirably causing the amplifier to have self-oscillatory tendencies.

The load-line limiting circuitry (R20, 21, Q22) for limiting base drive to Q1A is retained and helps in establishing quiescent bias conditions, since it reduces the quiescent collector current in Q3 and hence the quiescent base current to support that collector current. Resistor R40 is to have such resistance $R_{40}$ that for quiescent conditions the drop across R40 is small (e.g., 18 millivolts) and that for increased supply of drive current of Node N2 the drop across R40 increases such that the increased drive flows primarily to the base of Q4 rather than to the base of Q3. For, under those increased drive conditions, Q3, limited in its available collector current to the collector current supplied by Q51, will exhibit saturation or collector-bottoming; and the fall off in the $h_{fe}$ of Q3 resulting from saturation will lower its base input resistance. Making the drop across R40 acceptably small under quiescent conditions is aided by the reduction in the quiescent base current of Q3 made possible by the load-line-limiting circuitry comprising R20, Q21, Q22. The series connection of resistor R43 and forward-poled diode-connected transistor Q60 from terminal OUT to the collector of Q3 tends to keep Q3 out of saturation when base drives to Q4, Q2A and Q2B are curtailed. In a typical design R43 has a resistance $R_{43}$ of one kilohm.

The idling current $I_O$ demanded at the collector of Q2B depends upon its emitter-to-base voltage $V_{BE-Q2B}$. Kirchoff's Law of voltages requires that the relationship set forth in equation (1), following, always obtain. $V_{BE-Q2A}$, $V_{BE-Q3}$, $V_{BE-Q4}$, $V_{BE-Q41}$, and $V_{BE-Q42}$ are the respective emitter-to-base voltages of Q2a, Q3, Q4, Q41 and Q42; and $I_{B-Q3}$ is the base current of Q3.

$$V_{BE-Q2B}+V_{BE-Q2A}+V_{BE-Q4}=V_{BE-Q3}+V_{BE-Q42}+V_{BE-Q41}+I_{B-Q3}R_{40} \quad (1)$$

The following well-known equation (2) describes transistor behavior.

$$V_{BE}=(kT/q)\ln(I_C/AJ_S) \quad (2)$$

wherein $V_{BE}$ is emitter-to-base offset voltage, k is Boltzmann's constant,

T is the absolute temperature at which the transistor is operated, q is the charge on an electron, $I_C$ is the collector current of the transistor only slightly smaller than its emitter current $I_E$, A is the effective area of the transistor emitter-base junction, and $J_S$ is the value of $I_C/A$ when $V_{BE}$ is zero-valued.

In a monolithic integrated circuit the values of $J_S$ for all transistors are substantially alike, and the transistors operate at substantially the same temperature T. The other quantities in equation 2 will be subscripted with the identification alphanumeric of the transistor with which they are associated.

From equation 2 it can be seen that any given positive change in $V_{BE}$ is associated with a certain factor by which its $I_C$ is multiplied, and that any negative change in $V_{BE}$ is associated with a certain factor by which its $I_C$ is divided. One can then choose design values for $I_{BEQ3}$ and $R_{40}$ which introduce a convenient scaling factor F between currents in the Q3, Q42, Q41 emitter-base junction stack and in the Q2B, Q2A, Q4 emitter-base junction stack. E.g., a 54 mV drop across R40 will be assumed by way of example. This 54 mV is apportioned 18 mV across each of the emitter-base junctions of Q41, Q42, Q3 which reduces the current through them by a factor F of two relative to their connection with R40 being replaced by direct connection. Assume that there is a nominal value of the common-emitter forward current gain $h_{fe-NPN}$ for the NPN transistors to be 100, for example, and that one designs for $I_{BQ3}$ equals 20 μA to cause an $I_{CQ3}$ of 2 mA. $R_{40}$ must then by Ohm's Law be 2700 ohms to obtain a drop of 18 mV across R40.

With the scaling factor F to be introduced by $I_{BQ3}R_{40}$ resolved, one may then substitute equation 2 into equation 1, multiply each side of the resulting equation by the factor (q/kT), and then convert from logarithmic to linear measurement to obtain equation 3 following.

$$(I_{C-Q2B}I_{C-Q2A}I_{C-Q4})A_{Q3}A_{Q41}A_{Q42}=F(I_{C-Q3}I_{C-Q41}I_{C-Q42})A_{Q2A}A_{Q2B}A_{Q4} \quad (3)$$

The currents on the right hand side of this equation are inter-related to each other by factors depending upon $h_{fe-NPN}$; and the currents on the left-hand side of this equation are inter-related to each other by factors depending upon $h_{fe-NPN}$, though the relationship between $I_{C-Q2A}$ and $I_{C-Q2B}$ is also affected by the current flow through R31, of course. Acting on these observations, one can act upon equation 3 to obtain equation 4, following.

$$(h_{fe-NPN}+1)(I^2_{C-Q2A}I_{C-Q2B})A_{Q3}A_{Q41}A_{Q42}+FI^3_{C-Q3}A_{Q2A}A_{Q2B}A_{Q4} \quad (4)$$

In this equation, continuing the design assumptions previously made, F has a value of two; $(h_{fe-NPN}+1)=101$—or 100, for all practical purposes; $I_{C-Q4}$ has a value of 2 mA, if R31 is chosen as in the FIG. 4 amplifier; and $I_{C-Q3}$ has a value of 2 mA. Solving for mA. of $I_{C-Q2B}$ in terms of transistor emitter-base junction areas one obtains the following result.

$$I_{C-Q2B}=4\times 10^{-2}(A_{Q2A}A_{Q2B}A_{Q4}/A_{Q3}A_{Q41}A_{Q42}) \quad (5)$$

At this juncture, one must decide whether or not the collector idling current flow of Q2B is to be supplied in part by quiescent emitter current flow from Q1B.

Suppose one decides that Q1B is to be conductive under idling conditions, with an idling current of, say, 2 mA. Resistor R21 as before is chosen to have a resistance $R_{21}$ for draining a 2 mA. quiescent emitter current from Q1A, so Q1A will demand a base current $I_{B-Q1A}$ of only about 20 μA., which is negligibly small. The maximum drive current available to the base of Q1A will, in addition to the 2 mA. relinquished by Q3 as it no longer demands collector current, be the current relinquished by Q22 as it no longer demands collector current. (This occurs when the terminal OUT is brought up close to B+ supply voltage by conduction of Q1B to shut off current flow through the series connection of R20 and the diode-connected Q21 in CMA connection with Q22.) Since this maximum drive current has been set by choice of R6, R7, Q50 and Q51 to be 5 mA to provide for a maximum current sourcing capability of $(h_{fe\text{-}NPN})^2$ times as large—i.e., 50 amperes at terminal OUT—under quiescent conditions, when terminal OUT is at ground potential, Q22 must demand a 3 mA collector current. If Q21 and Q22 have emitter-base junction areas in 1:1 ratio and if B+ has a value of 15 V, this means R20 has to have a resistance $R_{20}$ of about 4700 ohms. The quiescent emitter currents of Q21, Q22, Q1A and Q2B with their respective values of 3 mA, 3 mA, 2 mA and 2 mA sum to an $I_O$ of 10 mA which must flow as quiescent collector current $I_{C\text{-}Q2B}$ of Q2B. Returning to equation 5 one ascertains that $(A_{Q24}A_{Q2B}A_{Q4}/A_{Q3}A_{Q41}A_{Q42})$ must have a value of 250. This is satisfied, for example, by making $A_{Q24}{:}Q_{Q2B}{:}A_{Q4}{:}A_{Q3}{:}A_{Q41}{:}A_{Q42}{::}100{:}20{:}20{::}10{:}4{:}4$.

If one chooses to make Q1B non-conductive under idling conditions, then Q2B would only be called upon to sink a 6 mA quiescent $I_{C\text{-}Q2B}$. Returning to equation 5 one ascertains that $(A_{Q24} A_{Q2B} A_{Q4}/A_{Q3} A_{Q41} A_{Q42})$ must have a value of 150. This is satisfied, for example, by making $A_{Q24}{:}A_{Q2B}{:}A_{Q4}{:}A_{Q3}{:}A_{Q41}{:}A_{Q42}{::}100{:}12.2{:}12.2{::}10{:}4{:}4$.

The FIG. 5 type of push-pull amplifier preferably should have greater capability in providing positive drive current to node N2 than capability in providing negative drive current to node N2. This is taken care of in the coupling from node N2 at the collector of Q6 to node N4. This coupling includes an NPN emitter-follower transistor Q50 driving a non-linear current amplifier comprising resistor R51 and NPN transistors Q51 and Q62. When the emitter current of Q50 is relatively low, the potential drop across resistor R51 (having a resistance $R_{51}$ of 2400 ohms in these designs) is negligibly small; and Q51 and Q52 act as a CMA to combined emitter currents to node N2 equal to twice the emitter current of Q50. As the emitter current of Q50 increases, the potential drop across R51 increases directing a greater portion of the emitter current of Q50 to the base of Q52 to achieve more of the $(h_{fe\text{-}NPN}+1)$ common-collector-amplifier current gain capability of Q52 in applying amplified Q50 emitter current to node N2.

On negative excursions of signal current drive to node N2, the reduced base current to Q4 results in reduced emitter current from Q4 to flow as base current to Q2A. The resulting reduction in the emitter current of Q2A decreases the potential across R31 and Q2B emitter-base junction to bias that junction below conduction and cut off conduction of Q2B as between its collector and emitter electrodes. Reduced current to Node N2 also reduces the base current to Q3. Q3 responds with lessened collector current demand, so more of the collector current available from Q51 flows as base drive current to Q1A. Q1A responds with increased emitter current that develops an increased emitter-to-base voltage for Q1A, biasing it into conduction to pull up the voltage at terminal OUT towards B+ supply voltage. The load-line-limiting circuit functions to reduce the collector current demand of Q22, making base drive current more readily available to Q1A.

On positive excursions of signal current drive to node N2, Q3 is biased into increased conduction as between its collector and emitter electrodes and saturates as its collector current demand exceeds the collector current available from Q51. The drop across R40 increases so that an increasing portion of the current drive to node N2 flows to the base of Q4 rather than to the base of Q3. The increased emitter current from Q4 in response to this flows as increased base drive to Q2A, causing its emitter current to increase, raising the potential across R31 so most of the emitter current flows as base current to Q2B. The resulting increased conduction of Q2B as between its collector electrodes pulls terminal OUT closer in potential to the B− supply bus. This increases the collector current demanded by Q22 in the load limiting circuitry, further curtailing base current drive to Q1A.

A number of modifications of the FIG. 5 amplifier are possible—e.g., replacing the Darlington cascade of Q4 and Q2A with a single transistor or with a Darlington cascade of a greater number of transistors and altering the base circuitry of Q3 to suit. Q41 and Q42 may be replaced by a Darlington cascade connection of transistors with their collectors connected back to the base of the earlier of them in the cascade connection. Or Q42 and Q3 might be connected in Darlington cascade with some loss in pull-down capability. R31 might be replaced by a constant current generator, from the collector of an NPN transistor with constant emitter-to-base biasing.

What is claimed is:

1. A Class AB push-pull quasi-linear amplifier comprising:

input and output signal terminals;

first and second supply terminals for receiving an energizing potential therebetween;

a first plurality, N in number, of transistors of a first conductivity type in a first sequential arrangement, each transistor having a respective base electrode, each having respective emitter and collector electrodes defining the ends of a respective principal current conduction path the conductivity of which is controlled by current applied to the base electrode of that transistor, and each exhibiting a current gain between its base electrode and one of its emitter and collector electrodes appreciably greater than unity;

a second plurality, N in number, of transistors of said first conductivity type in a second sequential arrangement, each transistor having a respective base electrode, each having respective emitter and collector electrodes defining the ends of a respective principal current conduction path the conductivity of which is controlled by current applied to the base electrode of that transistor, and each exhibiting a current gain between its base electrode and one of its emitter and collector electrodes substantially corresponding to said current gain exhibited by a respective one of the transistors in said first plurality, with which it is paired;

means for connecting said first plurality of transistors, in order of said first sequential arrangement, in a first direct-coupled cascade amplifier with a current gain that is substantially equal to the product of the current gains of said first plurality of transistors, including means connecting said input signal terminal to the base electrode of the first transistor in said first sequential arrangement including means connecting the principal conduction path of each transistor except the last in said first sequential arrangement to control the current flowing to the base elecrode of the following transistor in said first sequential arrangement, and including a connection of the emitter electrode of the last transistor in said first sequential arrangement to said first supply terminal and a connection of its collector electrode to said output signal terminal;

means for connecting said second plurality of transistors, in order of said second sequential arrangement, in a second direct-coupled cascade amplifier with a current gain that is substantially equal to the product of the current gains of said second plurality of transistors and that is opposite in sense to that of said first direct-coupled cascade amplifier, including means connecting said input signal terminal to the base electrode to the first transistor in said second sequential arrangement, including means connecting the principal conduction path of each transistor except the last in said second sequential arrangement to control the current flowing to the base electrode of the following transistor in said second sequential arrangement, at least one current-inverting one of these transistors having its collector electrode connected to the base electrode of the following transistor in said second sequential arrangement, and including a connection of the emitter electrode of the last transistor in said second sequential arrangement to said output signal terminal and a connection of its collector electrode to said second supply terminal; and respective constant current generator means connected to the base electrode of each transistor in said first and second sequential arrangements which has connected to it the collector electrode of a preceding current-inverting transistor.

2. A Class AB push-pull quasi-linear amplifier comprising:

first, second, third, fourth, fifth and sixth transistors of a first conductivity type, each having respective base, emitter, and collector electrodes;

a first supply terminal to which the emitter electrodes of said second, third, fifth and sixth transistors connect and a second supply terminal to which the collector electrode of said first transistor connects, said first and second supply terminals for receiving an energizing potential therebetween;

an input signal terminal direct-coupled to the base electrodes of said fifth and sixth transistors;

an output signal terminal to which the emitter electrode of said first transistor and the collector electrode of said second transistor connect;

constant current generating means for supplying respective currents to the collector electrodes of said third, fifth and sixth transistors;

means for direct coupling the collector electrode of said fifth transistor to the base electrode of said third transistor;

means for direct coupling the collector electrode of said sixth transistor to the base electrode of said fourth transistor;

means for direct coupling the collector electrode of said third transistor to the base electrode of said first transistor;

means for direct coupling the emitter electrode of said fourth transistor to the base electode of said second transistor; and means for connecting the collector electrode of said fourth transistor to said second supply terminal.

3. A Class AB push-pull quasi-linear amplifier as set forth in claim 2 wherein said means for connecting the collector electrode of said fourth transistor to said second supply terminal includes resistive means for limiting the maximum collector current of said second transistor.

4. A Class AB push-pull quasi-linear amplifier as set forth in claim 2 wherein said means for coupling the collector electrode of said third transistor to the base electrode of said first transistor includes a seventh transistor of said first conductivity type, with a base electrode to which the collector electrode of said third transistor connects, with an emitter electrode that connects to the base of said first transistor and with a collector electrode that connects to said second supply terminal; and wherein said means for coupling the emitter electrode of said fourth transistor to the base electrode of said second transistor includes an eighth transistor of said first conductivity type, with a base electrode to which the emitter electrode of said fourth transistor connects, with an emitter electrode direct-coupled to the base electrode of said second transistor, and with a collector electrode connected for receiving potential to condition it for exhibiting potential-follower action between its base and emitter electrodes.

5. A Class AB push-pull quasi-linear amplifier as set forth in claim 4 including:

a first load-line limiting circuit responsive to increase and to decrease in the voltage between said signal output terminal and said second supply terminal respectively to increase and to decrease its demand for current at the base electrode of said seventh transistor.

6. A Class AB push-pull quasi-linear amplifier as set forth in claim 5 including:

a second load-line limiting circuit responsive to increase and to decrease in the voltage between said first supply terminal and said signal output terminal respectively to increase and to decrease its demand for current at the base electrode of said eighth transistor.

7. A Class AB push-pull quasi-linear amplifier as set forth in claim 5 including:

a second load-line limiting circuit responsive to increase and to decrease in the voltage between said first supply terminal and said signal output terminal respectively to increase and to decrease its demand for current at the base electrode of said fourth transistor.

8. A Class AB push-pull quasi-linear amplifier as set forth in claim 4, 5, 6 or 7 wherein said means for direct coupling the collector electrode of said fifth transistor to the base electrode of said third transistor includes a ninth transistor of said first conductivity type, with a base electrode to which the collector electrode of said fifth transistor connects, with an emitter electrode that connects to the base electrode of said third transistor, and with a collector electrode connected for receiving a potential to condition it for exhibiting potential-follower action between its base and emitter electrodes; and wherein said means for direct coupling the collector electrode of said sixth transistor to the base electrode of said fourth transistor includes a tenth transistor of said first conductivity type, with a base electrode to which the collector electrode of said sixth transistor connects, with an emitter electrode that connects to the base electrode of said fourth transistor, and with a collector electrode connected for receiving a potential to condition it for exhibiting potential-follower action between its base and emitter electrodes.

9. A Class AB push-pull quasi-linear amplifier comprising:

first, second, third and fourth transistor means similar in conductivity type each having respective base electrode means, emitter electrode means, and collector electrode means, said first and second transistor means exhibiting between their respective base and said other electrode means substantially equal corresponding current gains, and said third and fourth transistor means exhibiting between their respective base and said other electrode means substantially equal corresponding current gains;

a first supply voltage terminal to which the collector electrode means of said first and fourth transistor means connect;

a second supply voltage terminal to which the emitter electrode means of said second and third transistor means connect;

an input signal terminal to which the base electrode means of said third transistor means connects;

an output signal terminal to which the emitter electrode means of said first transistor means and the collector electrode means of said second transistor means connect;

first current generating means connected to a node to which the base electrode means of said first transistor means and the collector electrode of said fourth transistor means connect;

second current generating means connected to a node to which the base electrode means of said second transistor means and the emitter electrode means of said third transistor means connect; and potential offsetting means connected between said input signal terminal and the base electrode means of said fourth transistor.

10. A Class AB push-pull quasi-linear amplifier comprising:

first, second, third, and fourth transistor means similar in conductivity type, each having base electrode means, emitter electrode means, and collector electrode means, said first and second transistor means exhibiting between their respective base and said other electrode means substantially equal corresponding current gains, and said third and fourth transistor means exhibiting between their respective base and said other electrode means substantially equal corresponding current gains;

a first supply voltage terminal to which the collector electrode means of said first and third transistor means connect;

a second supply voltage terminal to which the emitter electrode means of said second and fourth transistor means connect;

an input signal terminal to which the base electrode means of said third transistor means connects;

an output signal terminal to which the emitter electrode means of said first transistor means and the collector electrode means of said second transistor means connect;

a connection of the emitter electrode means of said third transistor means to the base electrode means of said second transistor means;

potential offsetting means and resistive means serially connected between said input signal terminal and the base electrode means of said fourth transistor means;

means for generating a current for application to a node to which the base electrode means of said first transistor means and the collector electrode means of said fourth transistor means connect, the magnitude of which current varies linearly with the voltage at said output signal terminal, varying from a maximum when the voltage at said output terminal is closest to the voltage at said first supply voltage terminal to zero at a voltage between the voltages at said first and second supply voltage terminals.

11. A Class AB push-pull quasi-linear amplifier as set forth in claim 10 wherein said means for generating a current for application to a node comprises:

voltage-to-current converter means having an input circuit to which the voltage between said first supply voltage terminal and said output signal is applied and having an output circuit between said output signal terminal and said node; and constant current generating means for supplying a substantially fixed current to said node.

12. A Class AB push-pull quasi-linear amplifier as set forth in claim 11 wherein said voltage-to-current converter means comprises:

a current mirror amplifier with an output connection to said node, a common connection to said output signal terminal, and an input connection; and further resistive means connected between that input connection and said first supply voltage terminal.

13. A Class AB push-pull quasi-linear amplifier as set forth in claim 12 wherein the resistance of said further resistive means is chosen sufficiently low said first transistor means is non-conductive under quiescent input signal conditions.

* * * * *